United States Patent [19]

Arai et al.

[11] Patent Number: 4,571,486
[45] Date of Patent: Feb. 18, 1986

[54] HEATING METHOD OF SEMICONDUCTOR WAFER

[75] Inventors: Tetsuji Arai, Tachikawa; Yoshiki Mimura, Yokohama, both of Japan

[73] Assignee: Ushio Denki Kabushiki Kaisha, Tokyo, Japan

[21] Appl. No.: 582,259

[22] Filed: Feb. 22, 1984

[30] Foreign Application Priority Data

Mar. 16, 1983 [JP] Japan ................................. 58-42203

[51] Int. Cl.⁴ ............................................... F24H 3/00
[52] U.S. Cl. .................................. 219/354; 219/339; 219/347; 148/1.5
[58] Field of Search ............... 219/354, 339, 340, 347, 219/348, 349, 350, 351; 148/1.5; 118/720, 721; 156/620; 252/62.3 GA

[56] References Cited

U.S. PATENT DOCUMENTS 4,001,047 1/1977 Boah .................................... 148/1.5
4,135,027 1/1979 Anthony et al. .................... 156/620

Primary Examiner—C. L. Albritton
Assistant Examiner—Marvin M. Lateef
Attorney, Agent, or Firm—Ziems, Walter & Shannon

[57] ABSTRACT

A method for heating a semiconductor wafer having a first region to be heated and a second region requiring no heating thereof, which method comprises forming a film over at least one of the first and second regions so as to make the reflectivity of the surface of the first region smaller than the reflectivity of the surface of the second region, and then exposing the semiconductor wafer to a flash of light to heat same. The above method permits selectively heating the region which is required to be heated, and, at the same time, to avoid any overheating of the region where no heating is required. The above heating method is particularly effective for annealing a semiconductor wafer which has a large surface area.

3 Claims, 5 Drawing Figures

HEATING METHOD OF SEMICONDUCTOR WAFER

BACKGROUND OF THE INVENTION (1) Field of the Invention

This invention relates to a heating method of a semiconductor wafer, and more particularly to a heating method of a semiconductor wafer which has a first region to be heated and a second region requiring no heating.

(2) Description of the Prior Art

A semiconductor wafer (hereinafter may be referred to merely as "wafer" for brevity) is used as a substrate for fabricating a semiconductor device such as an integrated circuit or large-scale integrated circuit. In the course of fabrication of such a semiconductor device, a variety of heating steps is required depending on what end use would be made of the semiconductor device. Among such heating steps, there are for example an annealing step for healing crystal defects in an ion-implanted layer of the wafer, a thermal diffusion step for thermally diffusing dopants incorporated in the wafer, a heat treatment step for activating dopants, etc. As a method for conducting, for instance, the annealing step from the above-mentioned various heating steps, there has conventionally been known heating a wafer in an electric resistive furnace. Reflecting the recent demand for higher densification of semiconductor devices, it is now required to control a pattern of distribution of dopant atoms along a surface of the wafer more minutely. Thus, it is no longer permissible to ignore thermal diffusion and redistribution of dopant atoms along the surface of the wafer which take place upon annealing each wafer. Owing to the above problem, is is now required to make the annealing time as short as feasible. However, it is difficult to conduct a sufficient heat treatment of a wafer in the electric resistive furnace in a short period of time during which no thermal diffusion of dopant atoms or the like substantially takes place.

With a view toward overcoming the difficulty which electric resistive furnaces have encountered, there has been developed a novel annealing method which makes use a laser beam an electron beam. This novel method is certainly effective in carrying out a heat treatment in a short period of time. However, it is accompanied by such problems that damage may occur in a surface of a wafer since the radiant beam is monochromatic, having a single wavelength, and accordingly considerable interference of the radiant beam and reflected beam takes place and a problem of discontinuity or non-uniformity develops along the boundary of each two adjacent scanning lines when a wafer is scanned by a single beam. Due to such problems, the above annealing method is not suited, especially, for annealing a wafer of large surface area.

With the foregoing in view, it has currently been attempted to develop a method for heating a wafer for annealing, by exposing the wafer to a flash of light emitted from flash discharge lamps. Exposing to a flash of light permits the raising of the temperature of the water to a desired level in a short period of time during which no undesirable problem takes place. In addition, a flash of light, in other words, flashlight, is not light of a single wavelength and is thus less susceptible of developing interference between radiant light and reflected light, thereby successfully avoiding the development of damage in the surface of a wafer. Furthermore, flashlight is not a beam and, corollary to this, does not require scanning of the wafer. Therefore, the heating process of exposing the wafer to flashlight is free of the problem of discontinuity or non-uniformity which is developed along the boundary of each two adjacent scanning lines when the wafer is scanned. Thus, the application of a flash of light for annealing a wafer has another merit that the wafer may be of a large surface area.

When subjecting a wafer to a heat treatment, it is however necessary to heat a portion which requires such a heat treatment, and it is not preferred to heat in a same manner a portion which does not require such a heat treatment. Generally, a variety of layers such as, for example, an ion-implanted layer, a mask layer made of an oxide film for the ion implantation and the like is formed in a surface of a wafer which is to be heated for its annealing. The former portion (hereinafter called "the first portion") and the latter portion (hereinafter called "the second portion") are generally different in reflectivity. Due to the difference in reflectivity, the final temperature of the first portion is different from that of the second portion no matter how precisely the radiation source, namely, the radiation intensity of each flash of light is controlled. As a result, there is the problem that the first portion may not always be heated to a desired temperature level and the second portion may, instead, be exposed to undesirable elevated temperature and hence be damaged.

SUMMARY OF THE INVENTION

With the foregoing in view, the present invention has as its object the provision of a heating method of a semiconductor wafer which method permits to achieve a selective heating of a wafer region to be heated and avoids any overheating of another wafer region requiring no heating.

In one aspect of this invention, there is thus provided a method for heating a semiconductor wafer having a first region to be heated and a second region requiring no heating, which method comprises forming a film over at least one of the first and second regions so as to make the reflectivity of the surface of the first region smaller than the reflectivity of the surface of the second region, and then exposing the semiconductor wafer to a flash of light to heat same.

The above heating method permits selectively heating the region to be heated and, at the same time, avoiding any overheating of the region requiring no heating.

The above and other objects, features and advantages of the present invention will become apparent from the following description and the appended claims, taken in conjunction with the accompanying drawings.

DETAILED DESCRIPTION OF THE INVENTION AND PREFERRED EMBODIMENT

One example of this invention will hereinafter be described with reference to the accompanying drawings in which the heating method of this invention is applied to anneal a semiconductor wafer subsequent to its ion implantation.

Figure 1:
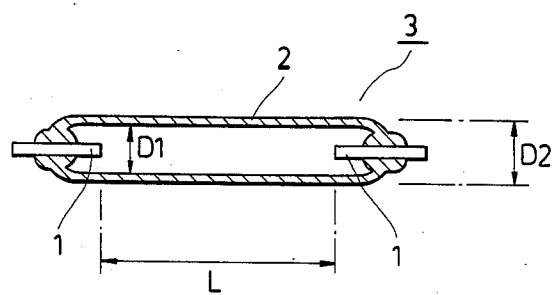
FIG. 1 is a schematic, axial, cross-sectional view of one example of a flash discharge lamp.

FIG. 1 illustrates one example of a flash discharge lamp which is used as a light source. Numerals 1, 1 indicate electrodes which are provided in a pair. Designated at numeral 2 is a sealed envelope. As exemplary dimensions of the flash discharge lamp, may be mentioned 40 mm, 8 mm and 10 mm, respectively, as the arc length L, the inner diameter D1 of sealed envelope 2 and the outer diameter D2 of the sealed envelope 2.

Figure 2:
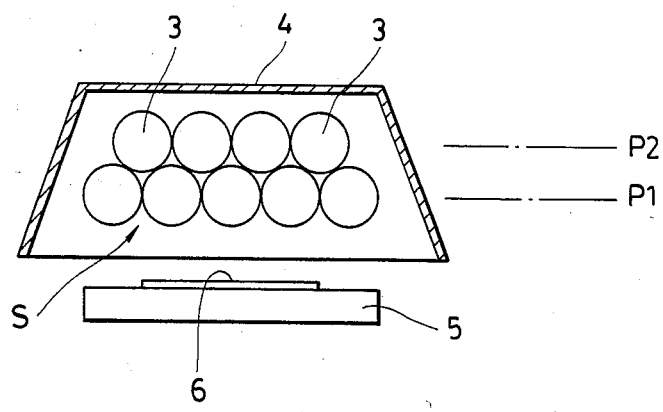
FIG. 2 is a simplified, transverse, cross-sectional view of one example of a heating apparatus which is equipped with flash discharge lamps.

FIG. 2 illustrates a heating apparatus constructed by arranging a number of flash discharge lamps each of which has the structure illustrated in FIG. 1. In the illustrated embodiment, nine flash discharge lamps 3 are arranged in two planes P1 and P2 which are parallel to each other and close to each other, namely, five flash discharge lamps 3 and four discharge lamps 3 are arranged close to one another and in a staggered pattern, thereby forming a plane flashlight source S of about 50 mm × 40 mm. Numeral 4 indicates a reflector surrounding the top and sides of the plane flashlight source S. Designated at numeral 5 is a specimen stage adapted to hold a wafer 6 to be heated at a position about 10 mm underneath the plane flashlight source S. Although not illustrated in the drawing, a heater is provided in a wafer-holding part of the specimen stage 5 so that the wafer 6 can be preheated by the heater prior to carrying out the principal heating of the wafer 6 by exposing same to a flash of light.

Figure 3:
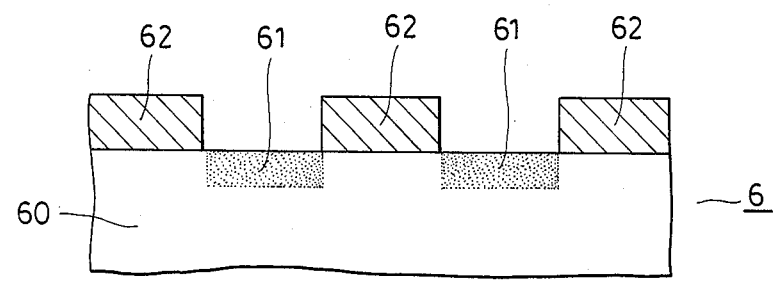
FIG. 3 is a fragmentary cross-sectional view of one example of a wafer to be annealed.

The wafer 6 may for example be as depicted in FIG. 3. In FIG. 3, numeral 60 indicates a silicon substrate whereas numeral 62 indicates a mask layer made of silicon oxide provided for implanting ions into desired regions of the silicon substrate 60. Designated at numeral 61 are ion-implanted layers formed by ion-implantation, in which, for example, $5 \times 10^{15}$ arsenic ions per square centimeter are introduced at 40 KeV into the desired regions of the silicon substrate 60 uncovered by the mask layer 62. The thickness of the silicon substrate 60 is about 300–650 $\mu$m. The depth of each of the crystal defect-containing portions in the ion-implanted layers 61 is about 0.2–1.0 $\mu$m. On the other hand, the thickness of the mask layer 62 is about 0.9 $\mu$m. In the wafer 6, regions of the ion-implanted layers 61 are regions to be heated and the remaining regions other than the ion-implanted layers 61 are regions requiring no heating thereof.

In one embodiment of this invention, an annealing of the above-described wafer 6 is carried out by heating the wafer 6 in the following manner in the heating apparatus of the above-described structure.

Figure 4:
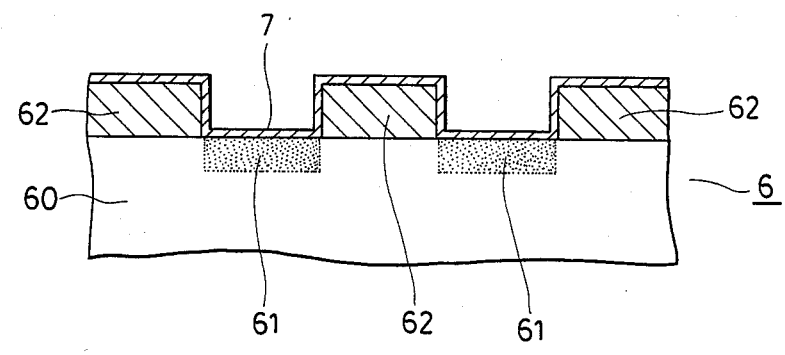
FIG. 4 is a fragmentary cross-sectional view of a wafer bearing a film formed on the surface thereof.

Namely, a film 7 having a thickness of about 0.1 $\mu$m and made of silicon oxide is formed first all over the entire surface of the wafer 6, as shown in FIG. 4. The film 7 may be formed by any thin-film fabrication technique which is known per se in the art.

Next, the wafer 6 bearing the film 7 formed thereon is placed on the wafer-holding part of the specimen stage 5 in the heating apparatus depicted in FIG. 2. Prior to heating the wafer by exposing it to a flash of light, the wafer 6 is preheated to about 350° C. by means of the heater of the specimen stage 5.

When the temperature of the wafer 6 has reached about 350° C. due to the heating by the heater the, entire surface of the wafer 6 is exposed to a flash of light emitted from the plane flashlight source S so that the entire surface of the wafer 6 is heated. The exposure to a flash of light is carried out under such conditions that the intensity of luminance on the surface of the wafer 6 is 18.5 Joule/cm$^2$ and exposure time (defined as full pulse width at half maximum of the flash of light) is 400 microseconds.

The heating of the wafer 6 is carried out in the manner mentioned above. In the heating of a wafer by exposing it to a flash of light, it is generally known that the final temperature of the surface of the wafer can be theoretically derived from the conditions of exposing the surface to a flashlight and the physical properties of the wafer. Let's now suppose that a wafer is exposed to a flashlight having a full pulse width t (unit: microseconds) at half maximum and a luminance intensity E (unit: Joules/cm$^2$) on the surface of the wafer which has an average reflectivity R. Where the full pulse width t is about 50 microseconds or longer, the final temperature T (°C.) of the surface of the wafer may be expressed approximately by the following equation (1).

$$T = a \cdot (1-R) \cdot E \cdot t^b + T_A \tag{1}$$

where,
a, b: constants determined by the thermal conductivity, density, specific heat, etc. of the material making up the wafer;
(1-R)·E: energy per unit area, absorbed in the wafer; and
$T_A$: temperature reached by the preheating of the wafer (if the wafer is preheated).

When the wafer is made of silicon, a and b are respectively about 540 and about −0.37.

The average reflectivity R may be defined by the following equation (2):

$$R = \frac{\int I(\lambda) R(\lambda) d\lambda}{\int I(\lambda) d\lambda} \tag{2}$$

where,
$I(\lambda)$: intensity of luminance at the wavelength $\lambda$; and
$R(\lambda)$: reflectivity of light of wavelength $\lambda$.

In the case of flashlight employed for heating a wafer, $I(\lambda)$ remains substantially constant. $R(\lambda)$ is determined by the optical constants (refractive index, attenuation coefficient, etc.) of each wafer or, when a film is formed over the surface of the wafer, by the optical constants (refractive index, attenuation coefficient, etc.) and thickness of the film.

Figure 5:
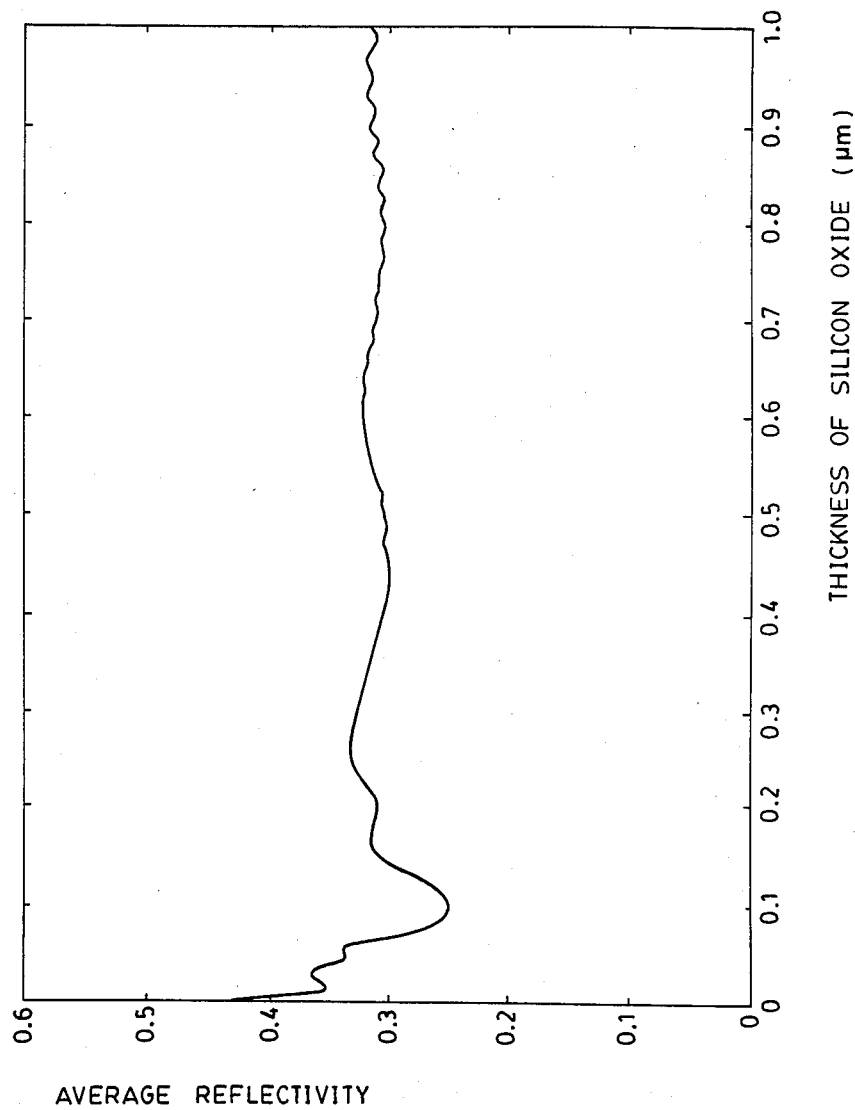
FIG. 5 is a curvilinear diagram showing the relationship between thickness of a film of silicon oxide and average reflectivity thereof.

FIG. 5 is a curvilinear diagram showing the relationship between the thickness of a film of silicon oxide formed on a surface of a wafer, which is made of silicon, and its average reflectivity R. As apparent from the diagram, the average reflectivity R remains relatively small while the thickness of the film of silicon oxide ranges from about 0.06 $\mu$m to about 0.15 $\mu$m. When the thickness exceeds 0.15 $\mu$m, the average reflectivity R does not vary too much but remains at about 0.31.

Taking the above-described theoretical background into consideration, some calculations will hereinafter be made. In the above-described heating method, the film 7 having a thickness of 0.1 μm and made of silicon oxide is formed on the surface of each region to be heated, namely, each ion-implanted layer 61 of the wafer 6. As determined from the curvilinear diagram of FIG. 5, the reflectivity of the surface of each region to be heated becomes about 0.26. On the other hand, a mask layer 62 is provided over each region which does not require any heating. The mask layer 62 is made of silicon oxide and its thickness is 0.9 μm. Since the film having a thickness of 0.1 μm and made of silicon oxide is further formed over the mask layer 62, the total thickness of silicon oxide on the region is 1.0 μm. As determined in the same manner from the curvilinear diagram of FIG. 5, the reflectivity of the surface of each region requiring no heating thereof becomes about 0.31. Thus, the reflectivity of the surface of each region to be heated has become smaller than the reflectivity of the surface of each region requiring no heating thereof. As a result, as readily understood from the above equation (1), the final temperature of the region to be heated will become higher than the final temperature of the region requiring no heating thereof. This means that each of the regions which require to be heated can be selectively heated, and each of the regions which do not require any heating thereof may be successfully prevented from overheating. Consequently, it is possible to achieve desirable annealing of the wafer and, at the same time, to avoid possible damage to the wafer due to overheating thereof.

Incidentally, the final temperatures of the wafer 6 in the above example will be calculated in accordance with the equation (1). The final temperature $T_1$ of each of the regions which require their heating is calculated as follows.

$$T_1 = 540 \times (1-0.26) \times 18.5 \times 400^{-0.37} + 350 = 1155$$
(°C.)

On the other hand, the final temperature $T_2$ of each of the regions which do not require their heating is also calculated as follows:

$$T_2 = 540 \times (1-0.31) \times 18.5 \times 400^{-0.37} + 350 = 1101$$
(°C.)

Thus, desirable annealing was achieved while successfully avoiding any overheating at each region where no heating is required. Regions which did not require heating were actually inspected after the heat treatment. No damages were observed there.

As a comparative test, heating was carried out in the same manner as in the above example except that the film 7 was not formed. The ion-implanted layers 61 were thus exposed. The reflectivity of each of the ion-implanted layers 61 was great, namely, 0.43 and the final temperature $T_1$ of each of the regions which required heating was thus calculated as follows:

$$T_1 = 540 \times (1-0.43) \times 18.5 \times 400^{-0.37} + 350 = 970$$
(°C.)

On the other hand, the final temperature $T_2$ of each of the regions where no heating was required was calculated as follows:

$$T_2 = 540 \times (1-0.31) \times 18.5 \times 400^{-0.37} + 350 = 1101$$
(°C.)

Namely, the final temperature $T_1$ of each of the regions which required their heating was lower than the final temperature $T_2$ of each of the regions where no heating was required, thereby failing to achieve required annealing.

Furthermore, a further heating test was carried out in the same manner as in the above comparative test except that the plane flashlight source S was adjusted to increase the luminance intensity E to 24 Joule/cm². The final temperature $T_1$ of each of the regions which required their heating was calculated as follows:

$$T_1 = 540 \times (1-0.43) \times 24 \times 400^{-0.37} + 350 = 1155$$
(°C.)

On the other hand, the final temperature $T_2$ of each of the regions where no heating was required was calculated as follows:

$$T_2 = 540 \times (1-0.31) \times 24 \times 400^{-0.37} + 350 = 1324$$
(°C.)

Thus, the annealing of each of the ion-implanted layers 61 was successfully achieved but the regions where no heating was required were overheated to considerable extents and developed damages such as additional crystal defects and cracks, thereby making the wafer no longer suitable for actual application.

In the above example, it is also possible to bring about such additional effects as will be mentioned below. In the example, employed as the wafer, was a wafer made of silicon and having the mask layer 62, which was a film of 0.9 μm thick and made of silicon oxide, over the regions where no heating was required. As a material making up the film 7, silicon oxide was chosen; the thickness of the film 7 was controlled within the range of 0.06–0.15 μm, namely, at 0.1 μm; and the film 7 was formed over the entire surface of the wafer uniformly. As readily envisaged from the curvilinear diagram given in FIG. 5, the reflectivity of the surface of each of the regions which required heating became smaller than the reflectivity of each of the regions where no heating was required. Thus, the provision of the mask layers 62 has made it unnecessary to form the film 7 selectively on certain specific regions of the wafer, thereby making the formation work of the film 7 extremely easy. Besides, the wafer is preheated prior to heating same by exposing it to a flash of light. This permits to lowering the necessary luminance intensity of the flashlight which is required to raise the temperature of the surface of the wafer to a desired level, thereby prolonging the service life of each flash discharge lamp.

One example of this invention has been described above. It should however be borne in mind that a variety of changes and modifications may be made in the present invention. For example, it may be feasible to employ, as a material making up the film 7, silicon nitride ($Si_3N_4$ or the like), PSG ($SiO_2$ glass containing 8% of $P_2O_5$), aluminum or the like instead of silicon oxide. Similar to the film of silicon oxide, the reflectivity of a film made of such material can be changed by selecting the thickness of the film. The film 7 may be formed only over regions which are required to be heated or only over regions where no heating is required. Alternatively, the film 7 may also be applied to different thicknesses over regions which are required to be heated and regions where no heating is required. It is necessary to make the reflectivity of the surface of each region which is to be heated smaller, by the provision of the film 7, than the reflectivity of the surface of each region where no heating is required, no matter how the film 7 is applied.

In the above example of this invention, the ion-implanted layers of the wafer were annealed. Needless to say, the present invention may also be applied to other heat treatments of a wafer.

Having now fully described the invention, it will be apparent to one of ordinary skill in the art that many changes and modifications can be made thereto without departing from the spirit or scope of the invention as set forth herein.

What is claimed is:

1. A method for heating a semiconductor wafer having a first region to be heated and a second region requiring no heating thereof, which method comprises forming a film over at least one of the first and second regions so as to make the reflectivity of the surface of the first region smaller than the reflectivity of the surface of the second region, and then exposing the semiconductor wafer to a flash of light to heat same.

2. A method as claimed in claim 1, wherein the film is made of silicon oxide and the thickness of the film over the first region is within the range of 0.06–0.15 μm.

3. A method as claimed in claim 1, wherein the full pulse width at half maximum of the flash of light is not more than 1/1000 second.

* * * * *